US012595554B2

(12) United States Patent
Kim et al.

(10) Patent No.: US 12,595,554 B2
(45) Date of Patent: Apr. 7, 2026

(54) METHOD FOR AREA-SELECTIVE GROWTH OF NOBLE METAL THIN FILMS USING ATOMIC LAYER DEPOSITION

(71) Applicant: KOREA INSTITUTE OF SCIENCE AND TECHNOLOGY, Seoul (KR)

(72) Inventors: Han Kim, Seoul (KR); Ji-Soo Jang, Seoul (KR); Sunghoon Hur, Seoul (KR); Hyun-Cheol Song, Seoul (KR); Seung Hyub Baek, Seoul (KR); Ji-Won Choi, Seoul (KR); Jin Sang Kim, Wanju-gun (KR); Chong Yun Kang, Seoul (KR); Seong Keun Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 18/794,977

(22) Filed: Aug. 5, 2024

(65) Prior Publication Data

US 2025/0129469 A1      Apr. 24, 2025

(30) Foreign Application Priority Data

Oct. 19, 2023    (KR) ........................ 10-2023-0140605

(51) Int. Cl.
*C23C 16/04* (2006.01)
*C23C 16/06* (2006.01)
(52) U.S. Cl.
CPC .............. *C23C 16/04* (2013.01); *C23C 16/06* (2013.01)
(58) Field of Classification Search
CPC ................................ C23C 16/04; C23C 16/06
See application file for complete search history.

(56) References Cited

U.S. PATENT DOCUMENTS 9,469,899 B2 * 10/2016 Huotari ................... C23C 16/34
9,716,012 B2    7/2017 Thompson et al.
(Continued)

FOREIGN PATENT DOCUMENTS

CN        108671918 A  * 10/2018  ........... B01J 23/656
KR     10-2027776 B1   11/2019
(Continued)

OTHER PUBLICATIONS

Tsujioka, Tsuyoshi, et al., "Selective noble-metal deposition modulation on photocurable polydimethylsiloxane flms for electronics device applications". Applied Physics A (2021) 127:228, pp. 1-8.*
(Continued)

*Primary Examiner* — Bret P Chen
(74) *Attorney, Agent, or Firm* — NSIP Law

(57)    ABSTRACT

The method for area-selective growth of a noble metal thin film using atomic layer deposition comprises: a first step of preparing a substrate having a growth area and non-growth area showing a difference in nucleation delay, where the non-growth area generates a noble metal nucleus relatively late compared to the growth area during cycles of repeated atomic layer deposition; a second step of supplying a noble metal precursor and adsorbing the noble metal precursor to the growth area and the non-growth area of the substrate; a third step of converting the noble metal precursor into a noble metal atomic layer by supplying an oxidizing agent; and a step of growing a noble metal thin film in the growth area by repeating a combination of the second and third steps.

7 Claims, 12 Drawing Sheets

(56) References Cited

U.S. PATENT DOCUMENTS

| | | | |
|---|---|---|---|
| 11,608,557 B2 * | 3/2023 | Givens | H01L 21/02145 |
| 2006/0121733 A1 * | 6/2006 | Kilpela | H01L 21/76814 |
| | | | 257/E21.171 |
| 2007/0036892 A1 * | 2/2007 | Haukka | C23C 16/0218 |
| | | | 257/E21.171 |
| 2013/0084700 A1 * | 4/2013 | Swerts | C23C 16/04 |
| | | | 257/E21.575 |
| 2020/0354834 A1 * | 11/2020 | De Silva | C23C 16/04 |
| 2022/0189763 A1 | 6/2022 | Breeden et al. | |

FOREIGN PATENT DOCUMENTS

| | | | | |
|---|---|---|---|---|
| KR | 10-2020-0132998 A | 11/2020 | | |
| KR | 10-2021-0007713 A | 1/2021 | | |
| KR | 10-2023-0059167 A | 5/2023 | | |
| WO | WO 2018/170382 A1 * | 9/2018 | | C23C 16/04 |
| WO | WO 2019/200234 A1 | 10/2019 | | |

OTHER PUBLICATIONS

Zhang, Qiao, et al., "The dependence of photocatalytic activity on the selective and nonselective deposition of noble metal cocatalysts on the facets of rutile". Journal of Catalysis, 337 (2016) 36-44.*

Deminskyi, Petro, et al., "Area-selective atomic layer deposition of noble metals: Polymerized fluorocarbon layers as effective growth inhibitors". J. Vac. Sci. Technol. A 39, 022402 (2021) pp. 1-14.*

Lee, Jinseon, et al. "Inherently Area-Selective Atomic Layer Deposition of SiO2 Thin Films to Confer Oxide Versus Nitride Selectivity." Advanced Functional Materials 31.33, 2102556, 2021. (pp. 1-10).

Korean Office Action Issued on Aug. 11, 2025, in Counterpart Korean Patent Application No. 10-2023-0140605 (5 Pages in English, 4 Pages in Korean).

* cited by examiner

FIG. 1

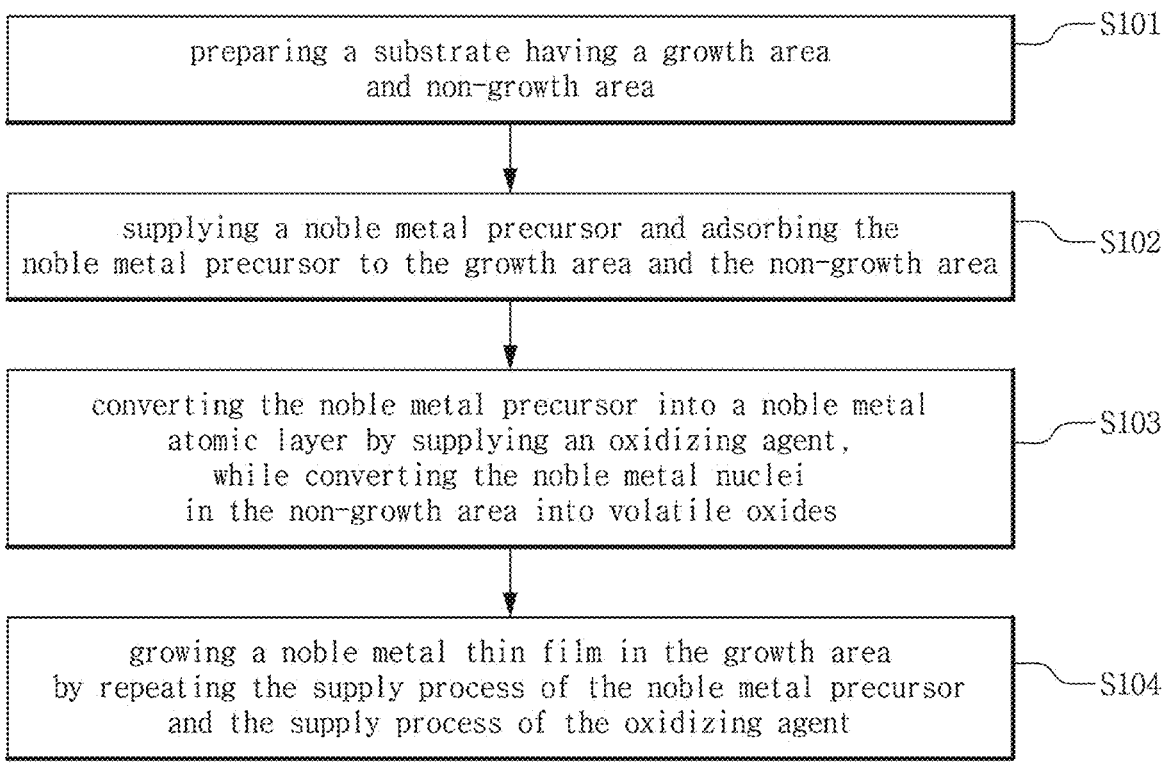

preparing a substrate having a growth area
and non-growth area —S101 supplying a noble metal precursor and adsorbing the
noble metal precursor to the growth area and the non-growth area —S102 converting the noble metal precursor into a noble metal
atomic layer by supplying an oxidizing agent,
while converting the noble metal nuclei
in the non-growth area into volatile oxides —S103 growing a noble metal thin film in the growth area
by repeating the supply process of the noble metal precursor
and the supply process of the oxidizing agent —S104

METHOD FOR AREA-SELECTIVE GROWTH OF NOBLE METAL THIN FILMS USING ATOMIC LAYER DEPOSITION

DESCRIPTION ABOUT NATIONAL RESEARCH AND DEVELOPMENT SUPPORT

This study was supported by the technology development programs of Ministry of Science and ICT, Republic of Korea (Projects No. 1711185280 and No. 1711201879) under the Korea Institute of Science and Technology.

CROSS-REFERENCE TO RELATED APPLICATIONS

The present application claims the benefit under 35 USC 119 (a) of Korean Patent Application No. 10-2023-0140605 filed on Oct. 19, 2023, in the Korean Intellectual Property Office, the entire disclosure of which is incorporated herein by reference for all purposes.

BACKGROUND OF THE INVENTION

1. Field of the Invention

The present invention relates to a method for area-selective growth of a noble metal thin film using atomic layer deposition. More particularly, the present invention relates to a method for area-selective growth of a noble metal thin film using atomic layer deposition, which can increase the growth thickness of a thin film with a high selectivity by inducing the generation of volatile noble metal oxides and suppressing the growth of the thin film in non-growth areas in depositing a noble metal thin film on the growth area of a substrate using nucleation delay.

2. Description of the Related Art

Lithography is a technology that is essentially applied to thin film patterning, but edge placement error (EPE) is occurring due to device miniaturization. EPE is a problem that occurs when a mask cannot be aligned to the correct position due to the miniaturization of the device during the lithography process, and this EPE reduces the reliability and durability of the device.

Area-selective atomic layer deposition was proposed as a way to solve the EPE problem of the lithography process. Area-selective atomic layer deposition is a method of depositing a thin film only on a specific area of a substrate and does not require a separate patterning process using a mask.

Area-selective atomic layer deposition methods are classified into methods using deposition inhibitors and methods using nucleation delay. The former method has the disadvantage of requiring a process of coating a deposition inhibitor on the non-growth area of the substrate, and process complexity or low selection ratio depending on the type of deposition inhibitor. When using nucleation delay, there is an advantage of not using a deposition inhibitor, but as the deposition cycle is repeated, the thin film grows in the non-growth area (see FIG. 2), so an additional etching process is required to remove the thin film in the non-growth area.

Korean Registered U.S. Pat. No. 2,027,776 (Patent Document 1) and Korean Patent Application Publication No. 2023-0059167 (Patent Document 2) disclose an atomic layer deposition method using a deposition inhibitor, and US Registered U.S. Pat. No. 9,716,012 (Patent Document 3) and 'Jinseon Lee et al., Inherently Area-Selective Atomic Layer Deposition of SiO2 Thin Films to Confer Oxide Versus Nitride Selectivity. Adv. Funct. Mater. 2021, 31, 2102' (Non-Patent Document 1) disclose an atomic layer deposition method using nucleation delay.

As disclosed in Patent Document 3 and Non-Patent Document 1, when nucleation delay is used, a thin film is formed in the non-growth area as the cycle repeats. Further, in order to increase the growth thickness of the thin film with a high selectivity in the growth area, an etching process for the thin film in the non-growth area is essential.

DOCUMENTS OF RELATED ART (Patent Document 1) Korean Registered U.S. Pat. No. 2,027,776 (published Nov. 4, 2019).

(Patent Document 2) Korean Patent Application Publication No. 2023-0059167 (published May 3, 2023).

(Patent Document 3) US Registered U.S. Pat. No. 9,716, 012 (published Jul. 25, 2017).

(Non-Patent Document 1) Jinseon Lee et al., Inherently Area-Selective Atomic Layer Deposition of SiO2 Thin Films to Confer Oxide Versus Nitride Selectivity. Adv. Funct. Mater. 2021, 31, 2102.

SUMMARY OF THE INVENTION

The present invention has been devised to solve the above problems, and has an object to provide a method for area-selective growth of a noble metal thin film using atomic layer deposition, which can increase the growth thickness of a thin film with a high selectivity by inducing the generation of volatile noble metal oxides and suppressing the growth of the thin film in non-growth areas in depositing a noble metal thin film on the growth area of a substrate using nucleation delay.

In order to achieve the above object, a method for area-selective growth of a noble metal thin film using atomic layer deposition according to the present invention is constituted to comprise a first step of preparing a substrate having a growth area and non-growth area showing a difference in nucleation delay; a second step of supplying a noble metal precursor and adsorbing the noble metal precursor to the growth area and the non-growth area of the substrate; a third step of converting the noble metal precursor into a noble metal atomic layer by supplying an oxidizing agent; and a step of growing a noble metal thin film in the growth area by repeating a combination of the second and third steps.

In the third step, the noble metal nucleus in the growth area and the non-growth area is converted into a volatile oxide and volatilized.

A novel metal included in the novel metal precursor is a novel metal capable of generating a volatile oxide.

The noble metal is any one of iridium (Ir), ruthenium (Ru), palladium (Pd), platinum (Pt), and rhodium (Rh).

The noble metal nucleus in the non-growth area reacts with the oxidizing agent and is converted into the volatile oxide, a molar ratio of the noble metal nucleus and the oxidizing agent is controlled to generate the volatile oxide.

The molar ratio of the noble metal nucleus and the oxidizing agent is controlled through control of supply time of the oxidizing agent.

The noble metal precursor is an Ir precursor, and the oxidizing agent is $O_3$ or $O_2$ plasma.

In the third step, Ir is converted to $IrO_3$ and volatilized by controlling the molar ratio between Ir and $O_3$. The molar ratio between Ir and $O_3$ is controlled by controlling $O_3$ supply time so that $O_3$ molar ratio exceeds 2 in a state where the molar ratio between Ir and $O_3$ is 3:2, or by controlling the $O_3$ supply time so that the $O_3$ molar ratio is greater than or equal to Ir molar ratio in the molar ratio between Ir and $O_3$.

A unit contact area where the Ir nucleus in the non-growth area is in contact with $O_3$ is relatively larger than the unit contact area where an Ir thin film in the growth area is in contact with $O_3$, so that generation of $IrO_3$ in the non-growth area is promoted.

The growth area is an $Al_2O_3$ area, and the non-growth area is a $SiO_2$ area.

The method for area-selective growth of noble metal thin films using atomic layer deposition according to the present invention has the following effects.

In the process of growing a noble metal thin film in the growth area of the substrate, the noble metal nuclei in the non-growth area react with an oxidizing agent and are converted into volatile oxides and volatilized, so that the noble metal thin film can be grown with a high selectivity. In addition, since the noble metal nuclei in the non-growth area are continuously annihilated in the process of growing the noble metal thin film in the growth area, theoretically, the thickness of the noble metal thin film in the growth area can be selectively increased as needed.

In addition, unlike the conventional area-selective atomic layer deposition method using nucleation delay, an etching process to remove the thin film in the non-growth area is not required.

BRIEF DESCRIPTION OF THE DRAWINGS

FIG. 1 is a flowchart illustrating a method for area-selective growth of a noble metal thin film using atomic layer deposition according to an embodiment of the present invention.

DETAILED DESCRIPTION OF THE INVENTION

Figure 2:
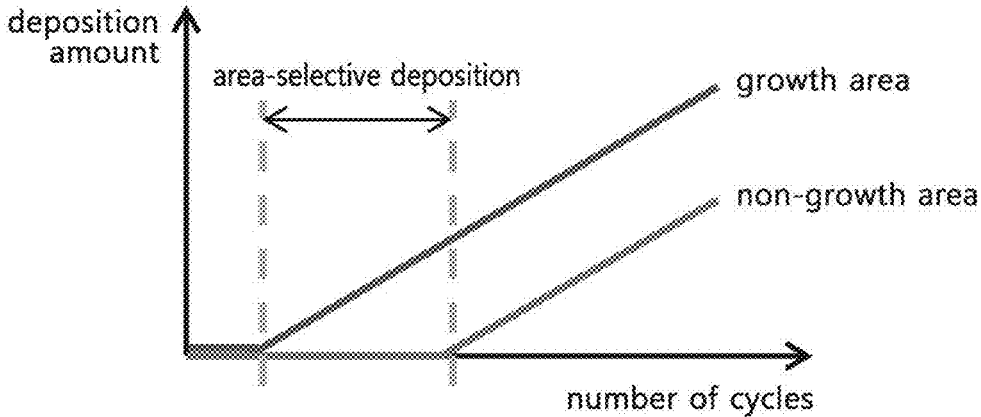
FIG. 2 is a reference diagram for explaining an area-selective atomic layer deposition method using nucleation delay.

The present invention proposes a technology that may grow noble metal thin films in a growth area with a high selectivity while not requiring an etching process to remove the thin film grown in a non-growth area, by suppressing the growth of the thin film in the non-growth area when growing the noble metal thin films through an area-selective atomic layer deposition method using nucleation delay.

As previously described in 'Description of the Related Art', when a thin film is selectively deposited on the growth area of the substrate using nucleation delay, the thin film is also deposited on the non-growth area as the cycle of the deposition process is repeated. To solve this problem, an etching process is generally applied to remove the thin film in the non-growth area (see Patent Document 3 and Non-Patent Document 1). In this way, if a separate etching process is applied to remove the thin film in the non-growth area, the effect of process simplification, which is an advantage of the area-selective atomic layer deposition method, is diluted. Further, in order to achieve a high selectivity, the etching process must be repeated, so there is a limit to increasing the growth thickness of the thin film.

The present invention focuses on the characteristic that noble metals are converted into volatile oxides under specific conditions, and proposes a technology that can grow novel metal thin film with a high selectivity in the growth area without a separate etching process by continuously converting the noble metal nuclei deposited in the non-growth area into volatile oxides, and suppressing the growth of novel metal thin films in the non-growth area. In addition, through this method, the growth thickness of the noble metal thin film may be dramatically increased compared to the conventional art.

When depositing a noble metal thin film using the atomic layer deposition method, the noble metal precursor adsorbed on the substrate is converted to a noble metal by removing its ligand through a reaction with an oxidizing agent such as $O_3$ or $O_2$ plasma, and thus, the novel metal thin film grows by repeating the process. For example, the Ir precursor is converted to Ir by reaction with $O_3$ to grow an Ir thin film. When the Ir precursor reacts with $O_3$, $IrO_2$ or $IrO_3$ may be generated in addition to Ir depending on the amount of $O_3$ supplied.

$IrO_2$ and $IrO_3$ are reactants generated by excessive supply of $O_3$. $IrO_2$ is a solid substance and $IrO_3$ is a volatile oxide and a gaseous substance. Therefore, $IrO_2$ is deposited on the substrate, whereas $IrO_3$ is volatilized upon its formation and is not deposited on the substrate. Based on these reaction characteristics, if it is possible to convert Ir deposited in the non-growth area of the substrate into $IrO_3$, the growth of the Ir thin film in the non-growth area may be minimized.

Since $IrO_2$ and $IrO_3$ are reactants generated by excessive supply of $O_3$ after the formation of Ir, the generation of $IrO_2$ or $IrO_3$ may be induced by controlling the amount of $O_3$ supplied. For example, the generation of $IrO_2$ or $IrO_3$ may be induced by controlling the molar ratio of Ir and $O_3$.

Referring to Reaction Schemes 1 to 3 below, in case that the molar ratio of Ir and $O_3$ is 3:2, $IrO_2$ is generated (Rection Scheme 1), and in case that the molar ratio of Ir and $O_3$ is 1:1, $IrO_3$ is generated (Reaction Scheme 2). In addition, $IrO_3$ is generated even in case that the molar ratio of $IrO_2$ and $O_3$ is 3:1 (Reaction Scheme 3).

Therefore, in a state where the molar ratio between Ir and $O_3$ is 3:2, if the $O_3$ molar ratio exceeds 2, $IrO_3$ is generated, and if the $O_3$ molar ratio is greater than or equal to the Ir molar ratio in the molar ratio between Ir and $O_3$, it can be seen that the reaction for $IrO_3$ generation occurs predominantly. In this way, the growth of the Ir thin film in the non-growth area may be suppressed by controlling the molar ratio between Ir and $O_3$.

$$2O_3 \rightarrow 3O_2$$

$$3Ir(s)+_3O_2 \rightarrow 3IrO_2(s) \qquad \text{(Reaction Scheme 1)}$$

$$2O_3 \rightarrow 3O_2$$

$$2Ir(s)+_3O_2 \rightarrow 2IrO_3(g) \qquad \text{(Reaction Scheme 2)}$$

$$2O_3 \rightarrow 3O_2$$

$$6IrO_2(s)+3O_2 \rightarrow 6IrO_3(g) \qquad \text{(Reaction Scheme 3)}$$

In addition to controlling the molar ratio between Ir and $O_3$ described above, Ir nuclei growth behavior in the non-growth area accelerates the conversion of Ir to $IrO_3$, which is explained as follows.

As $IrO_3$ is generated by the molar ratio between Ir and $O_3$, the larger the contact area between Ir nuclei and $O_3$, the more $IrO_3$ generation is promoted. In other words, the larger the unit contact area of Ir in contact with $O_3$, the greater the $IrO_3$ generation efficiency.

Figure 3:
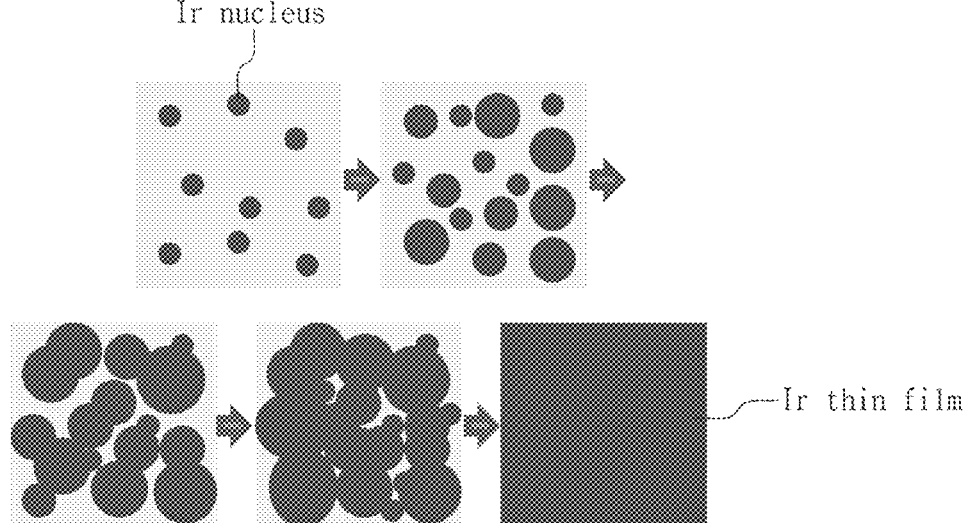
FIG. 3 is a reference diagram for explaining the growth behavior of a noble metal thin film.

Considering the growth behavior of the Ir thin film, Ir nuclei are generated in the form of islands on the substrate, and through repetition of the deposition cycle, the size of the Ir nuclei increases and the Ir nuclei merges with neighboring Ir nuclei, and through the continuous deposition process, Ir thin film are formed (see FIG. 3).

Figure 4:
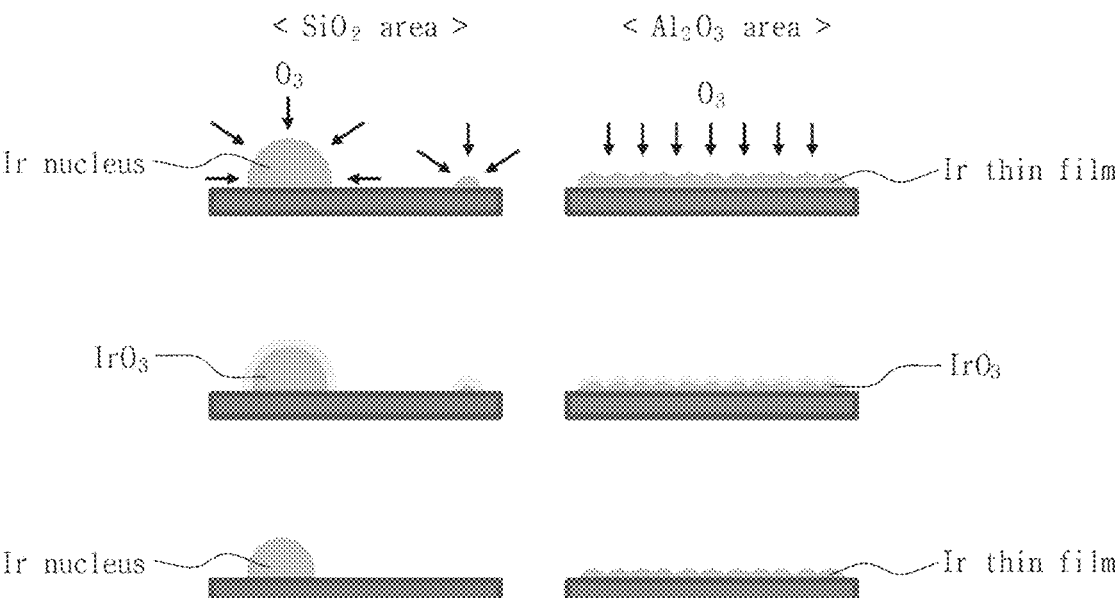
FIG. 4 is a reference diagram for explaining a unit contact area of Ir with $O_3$ in a growth area and non-growth area.

This growth behavior of the Ir thin film applies equally to both the growth area and the non-growth area, but the growth behavior of the Ir thin film in the non-growth area is expressed late due to the nucleation delay between the growth area and the non-growth area. That is, in a state where the Ir thin film with a predetermined thickness is grown in the growth area, Ir nuclei begin to be generated in the non-growth area as the deposition cycle is repeated (see FIG. 4).

In this way, at the same deposition time, the Ir thin film with densely packed Ir nuclei is formed in the growth area, while in the non-growth area, the Ir nuclei exist in the form of an island. Therefore, when $O_3$ is supplied, a unit contact area where the Ir nucleus in the non-growth area is in contact with $O_3$ is much larger than a unit contact area where the Ir thin film in the growth area is in contact with $O_3$ (see FIG. 4).

Therefore, as described above, the larger the unit contact area of Ir in contact with $O_3$, the greater the $IrO_3$ generation efficiency. While the Ir nuclei initially produced in the non-growth area react with $O_3$ and are easily converted to $IrO_3$, the Ir thin film in the growth area has a relatively small unit contact area with $O_3$, resulting in a low conversion rate of Ir to $IrO_3$.

Based on this principle, in converting Ir in the non-growth area into $IrO_3$ by controlling the molar ratio between Ir and $O_3$, the conversion of the Ir thin film in the growth area to $IrO_3$ is minimized and at the same time, the conversion of the Ir in the non-growth area to $IrO_3$ can be accelerated.

Hereinafter, a method for area-selective growth of a noble metal thin film using atomic layer deposition according to an embodiment of the present invention will be described in detail with reference to the drawings.

Referring to FIG. 1, first a substrate is prepared (S101). The substrate includes a growth area and a non-growth area. The growth area refers to an area where a noble metal thin film is grown, and the non-growth area refers to an area set to prevent the noble metal thin film from growing.

The growth area and non-growth area are distinguished by the characteristic of delayed generation of noble metal nuclei. In other words, in the process of repeating the atomic layer deposition cycle, the non-growth area exhibits the characteristic of generating noble metal nuclei relatively late compared to the growth area. Nucleation delay may be provided by varying the constituent materials of the substrate. In one embodiment, the substrate in the growth area may be made of aluminum oxide ($Al_2O_3$), and the substrate in the non-growth area may be made of silicon oxide ($SiO_2$) to provide nucleation delay characteristics. Referring to Experimental Example described later, Ir nuclei are generated in the growth area, $Al_2O_3$, after 120 deposition cycles are repeated, while Ir nuclei are generated in the non-growth area, $SiO_2$, after 240 deposition cycles are repeated.

In a state where the substrate divided into the growth area and non-growth area is mounted on the reaction chamber of an atomic layer deposition apparatus, a noble metal precursor supply process (S102) and an oxidant supply process (S103) are repeated to form a precious metal thin film in the growth area of the substrate (S104).

The noble metal precursor supply process includes supplying the noble metal precursor into the reaction chamber for a predetermined period of time, adsorbing the noble metal precursor on the growth area of the substrate, and purging the non-adsorbed noble metal precursor using an inert gas. The noble metal precursor is a material containing a noble metal and a ligand, and the noble metal is a material that may generate volatile oxides and may refer to any one of iridium (Ir), ruthenium (Ru), palladium (Pd), platinum (Pt), and rhodium (Rh). Also, in the case of the noble metal precursor containing Ir and a ligand, tricarbonyl (1,2,3-η)-1,2,3-tri(tert-butyl)-cyclopropenyl iridium (TICP) may be used as an example.

The oxidizing agent supply process is a process of supplying an oxidizing agent to the reaction chamber in a state where the noble metal precursor is adsorbed on the growth area of the substrate. The reaction between the noble metal precursor and the oxidizing agent removes the ligand of the noble metal precursor to form a noble metal atomic layer. $O_3$ or $O_2$ plasma may be used as the oxidizing agent to convert the noble metal precursors into noble metals. In addition, the oxidizing agent supply process includes the process of purging reaction by-products such as ligands and unreacted oxidizing agent by injecting an inert gas after the noble metal atomic layer is formed by supplying the oxidizing agent.

The combination of the noble metal precursor supply process and oxidizing agent supply process corresponds to one deposition cycle, and by repeating a plurality of deposition cycles, the thickness of the noble metal thin film may be increased by repeatedly stacking the noble metal atomic layers on the growth area of the substrate.

However, as described above, the growth area and non-growth area are distinguished by nucleation delay characteristics, and when the deposition cycle reaches a predetermined number of times, noble metal nuclei are generated not only in the growth area but also in the non-growth area, and when additional deposition cycles are repeatedly performed, the novel metal thin film is formed. Here, it is mentioned again in Patent Document 3 and Non-Patent Document 1, that an etching process is applied to remove the thin film in the non-growth area in order to minimize the growth of the thin film in the non-growth area while continuously growing the thin film in the growth area.

The present invention suppresses growth of novel metal nuclei into the noble metal thin film by continuously anni- hilating the noble metal nuclei at the initial stage of the growth behavior of the noble metal thin film when the non-growth area reaches the nucleation growth deposition cycle, and this is achieved through the above-described process. Specifically, by controlling the supply amount of the oxidizing agent during the oxidizing agent supply pro- cess, the noble metal nuclei generated in the non-growth area may be continuously annihilated.

In a more specific embodiment, by controlling the molar ratio between the noble metal precursor and the oxidizing agent, the growth of the noble metal thin film can be suppressed by continuously annihilating the noble metal nuclei generated in the non-growth area.

The noble metal nuclei may be continuously annihilated by the conversion of the noble metal nuclei into volatile oxides. In other words, the noble metal nuclei generated in the non-growth area may be continuously annihilated by converting them into volatile oxides, which are gaseous substances.

The control of the molar ratio between the noble metal precursor and the oxidizing agent is explained using specific embodiments as an example. In case that an Ir precursor and $O_3$ are used as the noble metal precursor and oxidizing agent, respectively, Ir nuclei are generated by the reaction between the Ir precursor and $O_3$, and when $O_3$ is supplied in excess, $IrO_2$ and $IrO_3$ are generated by the reaction between Ir and $O_3$. $IrO_2$ is a solid material, and is deposited on the substrate, whereas $IrO_3$ is a gaseous material, and volatilizes upon generation and is not deposited on the substrate.

As previously explained with respect to Reaction Schemes 1 and 2, in case that the molar ratio of Ir and $O_3$ is 3:2, $IrO_2$ is generated (see Reaction Scheme 1), and in case that the molar ratio of Ir and $O_3$ is 1:1, $IrO_3$ is generated (see Reaction Scheme 2). Based on these Reaction Schemes 1 and 2, by controlling the molar ratio between Ir and $O_3$, the generation of $IrO_3$, a volatile oxide, may be promoted and the Ir nuclei generated in the non-growth area may be continuously annihilated. Here, controlling the molar ratio between Ir and $O_3$ may be implemented by controlling the supply time of the oxidizing agent in the oxidizing agent supply process.

Through the principle described above, the growth of the noble metal thin film in the non-growth area may be sup- pressed by continuously converting the noble metal nuclei generated in the non-growth area into volatile oxide, and the principle of the present invention does not require the etching process like in Patent Document 3 or Non-Patent Document 1. In addition, as the deposition cycle is repeated, the annihilation of the noble metal nuclei in the non-growth area occurs in parallel during the repetitive deposition cycle, the thickness of the noble metal thin film in the growth area may theoretically be selectively increased as needed. For reference, in the case of Non-Patent Document 1, $SiO_2$ with a thickness of about 4 nm is grown when only the nucleation delay characteristic is used without an etching process, and when an etching process is applied, the experimental result is presented that the thickness increases to 10 nm. On the contrary, in the case of the present invention, as described in Experimental Example described later, the Ir thin film with a thickness of about 20.4 nm may be grown without apply- ing an etching process.

As described above, a method for area-selective growth of a noble metal thin film using atomic layer deposition accord- ing to an embodiment of the present invention has been described. Hereinafter, the present invention will be described in more detail through Experimental Examples.

Experimental Example 1: Nucleation Delay Characteristics

In a state where a substrate divided into an $Al_2O_3$ area and $SiO_2$ area is mounted in an atomic layer deposition chamber, at the condition of 250° C., tricarbonyl (1,2,3-η)-1,2,3-tri (tert-butyl)-cyclopropenyl iridium (TICP) gas was supplied for 8 seconds, and then Ar gas was purged for 20 seconds. Then, $O_3$ was supplied for 5 seconds and Ar gas was purged for 15 seconds. The above deposition cycle was repeated 500 times.

Figure 5:
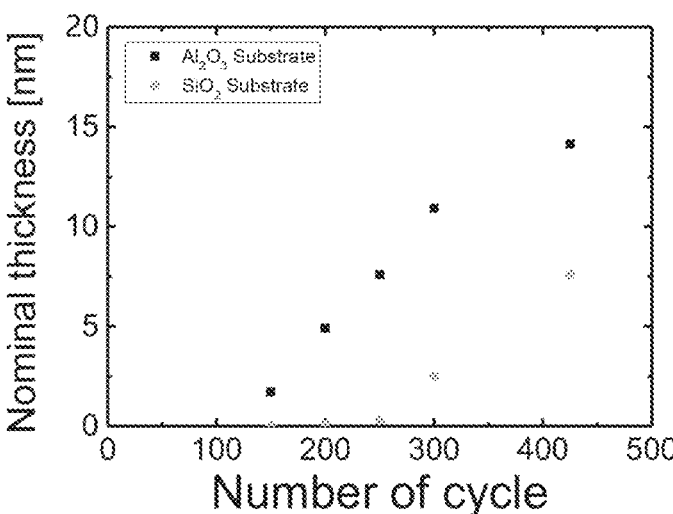
FIG. 5 shows the results of an experiment measuring a thickness of an Ir thin film in an $Al_2O_3$ area and $SiO_2$ area according to a deposition cycle.

As a result of measuring the thickness of the Ir thin film in the $Al_2O_3$ area and $SiO_2$ area according to the deposition cycle (see FIG. 5), the nucleation delay in the $Al_2O_3$ area was found to be about 120 times, and the nucleation delay in the $SiO_2$ area was found to be about 240 times. The deposition amount per deposition cycle (GPC) was mea- sured to be constant at about 0.6 Å.

Figure 6:
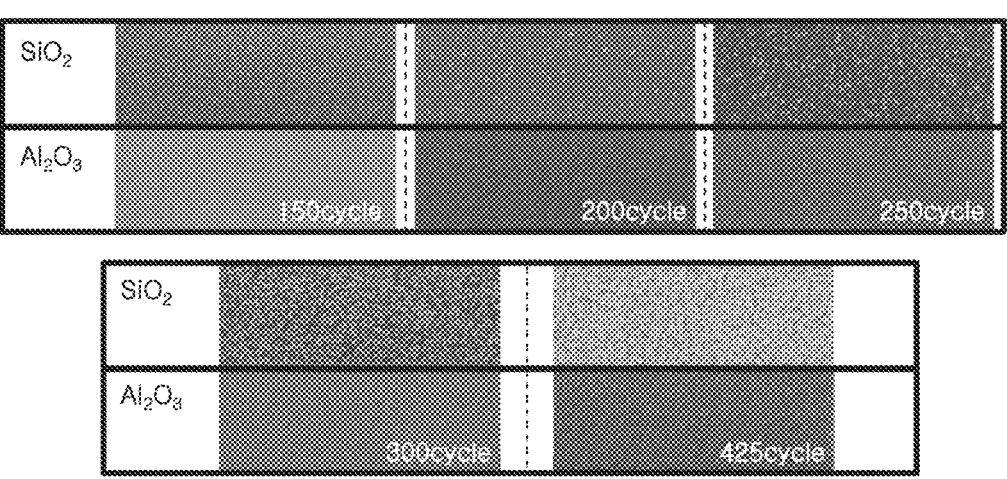
FIG. 6 shows SEM image of each of an $Al_2O_3$ area and $SiO_2$ area at the completion of 150, 200, 250, 300, and 425 deposition cycles.

In addition, as a result of SEM analysis of each of the $Al_2O_3$ area and $SiO_2$ area at the completion of 150, 200, 250, 300, and 425 deposition cycles in the above experiment (see FIG. 6), it was observed that while a smooth and continuous Ir thin film was formed in the $Al_2O_3$ area at 150 deposition cycles, small-sized Ir nuclei were formed at a long distance in the $SiO_2$ area. It can be confirmed that as the deposition cycle increases, the Ir thin film grows even in the $SiO_2$ area, which is a non-growth area.

Experimental Example 2: Phase Change Characteristics of a Thin Film According to Deposition Temperature and $O_3$ Supply Time The atomic layer deposition was performed using the process conditions of Experimental Example 1, but varying the deposition temperature and $O_3$ supply time. The depo- sition temperatures were 180, 200, and 250° C., and the $O_3$ supply time was varied to 3, 5, 10, 30, and 60 seconds for each deposition temperature. In addition, 500 deposition cycles were performed each.

Figure 7:
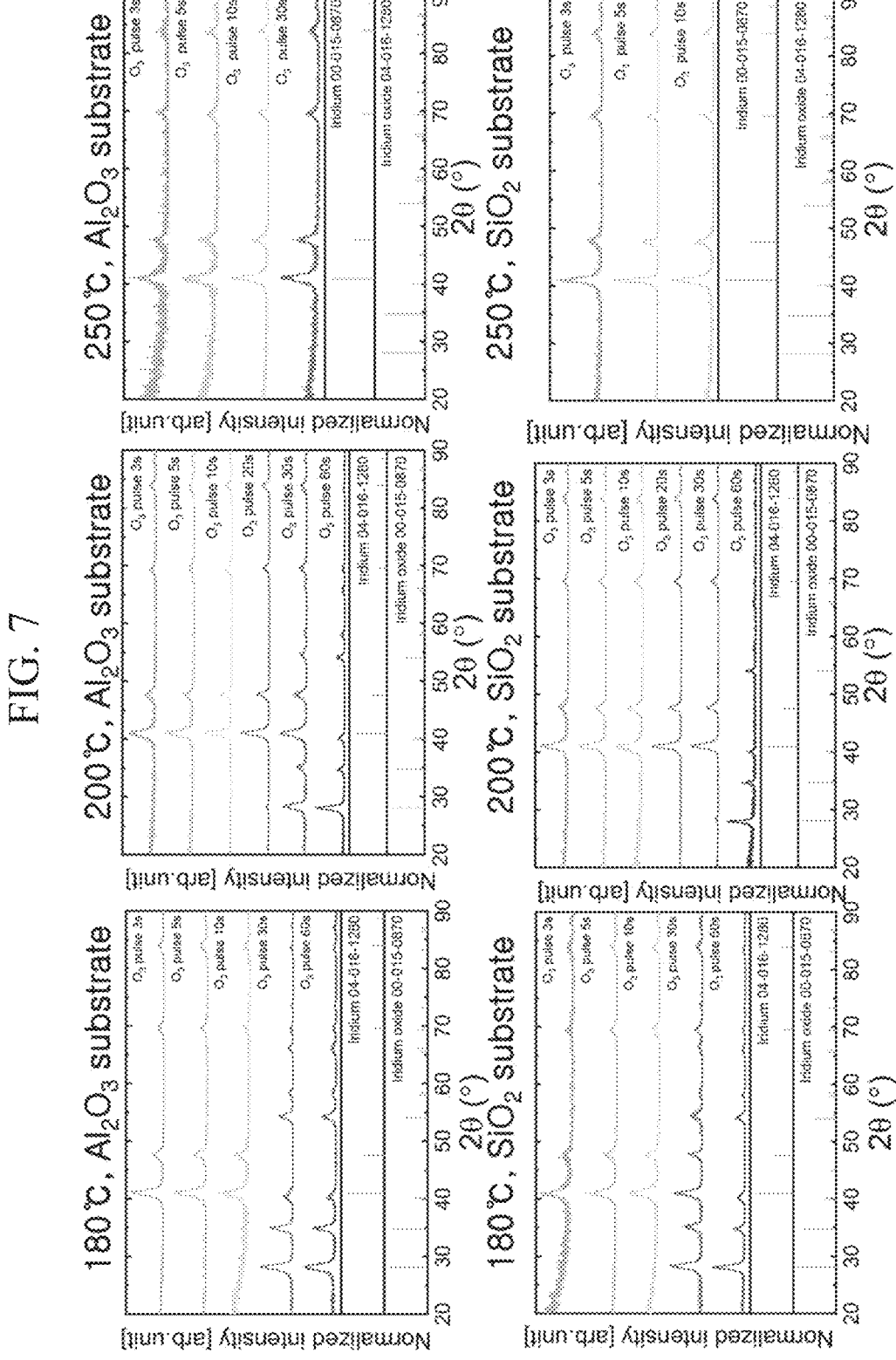
FIG. 7 shows the GIXRD analysis results of a thin film deposited according to a deposition temperature and O3 supply time in Experimental Example 2.

FIG. 7 shows the GIXRD analysis results of the thin film deposited according to the deposition temperature and $O_3$ supply time in Experimental Example 2, and Tables 1 and 2 below summarize the results of FIG. 7 and show the phase change data of the thin film according to process conditions. The peaks at the bottom of each GIXRD analysis result in FIG. 7 are peaks for Ir and $IrO_2$.

TABLE 1

<Phase change of a thin film according to deposition temperature and $O_3$ supply time in $Al_2O_3$ area>

| $Al_2O_3$ | | $O_3$ supply time | | | | |
|---|---|---|---|---|---|---|
| | | $O_3$ 3 s | $O_3$ 5 s | $O_3$ 10 s | $O_3$ 30 s | $O_3$ 60 s |
| Deposition | 180° C. | Ir | Ir | Ir | $IrO_2$ | $IrO_2$ |
| temperature | 200° C. | Ir | Ir | Ir | Ir/$IrO_2$ | $IrO_2$ |
| | 250° C. | Ir | Ir | Ir | Ir | — |

9

TABLE 2

| <Phase change of a thin film according to deposition temperature and O₃ supply time in SiO₂ area> | | | | | | |
|---|---|---|---|---|---|---|
| | | | | O₃ supply time | | |
| SiO₂ | | O₃ 3 s | O₃ 5 s | O₃ 10 s | O₃ 30 s | O₃ 60 s |
| Deposition temperature | 180° C. | Ir | Ir | Ir | Ir/IrO₂ | IrO₂ |
| | 200° C. | Ir | Ir | Ir | Ir | IrO₂ |
| | 250° C. | Ir | Ir | Ir | — | — |

Referring to FIG. 7, Table 1, and Table 2, in case that the deposition temperatures of 180° C. and 200° C. are applied, it can be confirmed that as the $O_3$ supply time becomes to 30 seconds or longer, the $IrO_2$ phase tends to be formed in both the $Al_2O_3$ area and the $SiO_2$ area. In addition, it can be seen that under the conditions of the same $O_3$ supply time, the $IrO_2$ phase is formed relatively well in the $Al_2O_3$ area. In addition, it can be confirmed that under the conditions of the same $O_3$ supply time, a pure Ir phase is generated as the deposition temperature increases.

It can be confirmed that under the deposition temperature condition of 250° C., the $IrO_2$ phase is not generated and only the Ir phase is generated, regardless of the substrate area and $O_3$ supply time. However, in case that the $O_3$ supply time is 60 seconds, neither the Ir phase nor the $IrO_2$ phase appears in the $Al_2O_3$ area, and in case that the $O_3$ supply time is 30 seconds or greater, neither the Ir phase nor the $IrO_2$ phase appears in the $SiO_2$ area. In this case, as the $O_3$ supply time lengthens, it is determined that the Ir phase is converted to $IrO_3$, a volatile oxide, and volatilized.

The phenomenon of Ir phase being converted to $IrO_3$ and volatilized by increasing $O_3$ supply time at a deposition temperature of 250° C. is also proven through changes in the amount of Ir deposition.

Figure 8:
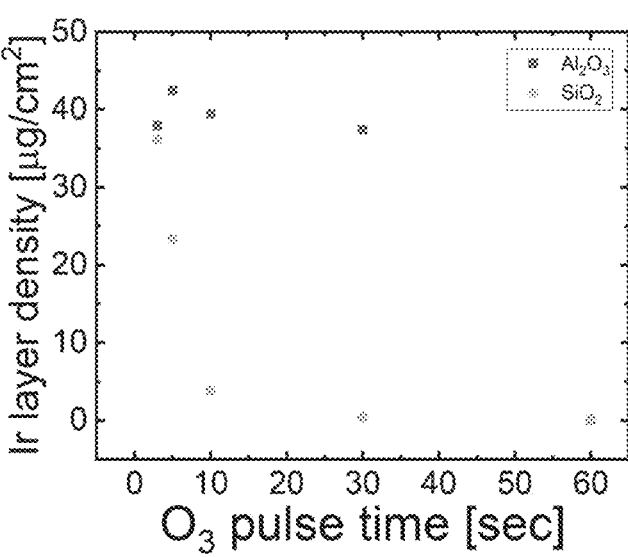
FIG. 8 shows an experimental result according to Experimental Example 2, showing a change in Ir deposition amount according to $O_3$ supply time under a deposition temperature of 250° C.

FIG. 8 shows an experimental result according to Experimental Example 2, showing the change in Ir deposition amount according to $O_3$ supply time under the conditions of a deposition temperature of 250° C. Referring to FIG. 8, it can be seen that the Ir deposition amounts in both the $Al_2O_3$ area and the $SiO_2$ area show the maximum amount under the condition of $O_3$ supply time of 3 to 5 seconds. Also, it can be seen that as the $O_3$ supply time becomes longer, the Ir deposition amount decreases, so in case that the $O_3$ supply time is 60 seconds, there is almost no amount of Ir deposition.

From these results, the supply amount of Ir precursor, that is, the supply amount of TICP, is the same regardless of the $O_3$ supply time. Therefore, the maximum amount of Ir deposited at a short $O_3$ supply time of 3 to 5 seconds decreases as the $O_3$ supply time becomes longer. Therefore, the decrease in Ir deposition amount means that the Ir phase changed into the $IrO_3$ phase and was volatilized.

Furthermore, from the results of FIG. 8, it can be confirmed that the decrease in Ir deposition amount according to $O_3$ supply time appears differently in the $Al_2O_3$ area and the $SiO_2$ area. In the $SiO_2$ area, the decrease in Ir deposition amount according to the $O_3$ supply time appears rapidly, and the Ir deposition amount converges to 0 after 10 seconds. On the contrary, in the $Al_2O_3$ area, the decrease in Ir deposition amount appears slowly, and the Ir deposition amount converges to 0 at 60 seconds.

In particular, under the condition that the $O_3$ supply time is 30 seconds, the Ir deposition amount is hardly reduced in the $Al_2O_3$ area, while the Ir deposition amount converges to 0 in the $SiO_2$ area, which can be said to be a result that is most consistent with the method for area-selective growth of a noble metal thin film according to the present invention. In addition, these results are experimental results that support the continuous annihilation of Ir nuclei generated in the $SiO_2$ area due to the difference in nucleation delay between the $Al_2O_3$ area and the $SiO_2$ area.

In the above, as an implementation principle of a method for area-selective growth of a noble metal thin film according to the present invention, the control of the molar ratio between Ir and $O_3$ and difference in the unit contact areas of Ir (Ir thin film vs. Ir nucleus) generated in each of the growth area ($Al_2O_3$) and the non-growth area ($SiO_2$) for $O_3$ have been described. That is, under conditions in which the molar ratio between Ir and $O_3$ is controlled (control of $O_3$ supply time), the Ir thin film is formed in the $Al_2O_3$ area due to the difference in nucleation delay, while Ir nuclei grow in the form of an island in the $SiO_2$ area. Therefore, the unit contact area of the Ir nuclei generated in the $SiO_2$ area for $O_3$ is relatively large compared to the Ir thin film in the $Al_2O_3$ area, so the conversion of the Ir thin film to $IrO_3$ in the $Al_2O_3$ area is minimized, and at the same time, the conversion of Ir nuclei to $IrO_3$ in the $SiO_2$ area is promoted (see FIG. 4).

In this way, area-selective growth of the Ir thin film may be realized by activating the growth of the Ir thin film in the $Al_2O_3$ area and continuously annihilating the Ir nuclei in the $SiO_2$ area through the conditions of deposition temperature of 250° C. and $O_3$ supply time of 30 seconds. Since continuous annihilation of Ir nuclei means the conversion of Ir nuclei into $IrO_3$, setting process conditions that enable the generation of $IrO_3$ is most important. As described above for the conditions for generating $IrO_3$, the molar ratio between Ir and $O_3$ was presented. However, since the generation of $IrO_3$ is influenced not only by the deposition temperature but also by the deposition pressure, the conversion of Ir nuclei into $IrO_3$ may be achieved by controlling the deposition temperature and deposition pressure.

Experimental Example 3: Maximum Thickness and Deposition Amount of Thin Film According to Application of Optimal Process Conditions An Ir thin film was deposited by applying 500 and 700 deposition cycles using the optimal process conditions, a deposition temperature of 250° C. and an $O_3$ supply time of 30 seconds, which were proven in Experimental Example 2

Figure 9:
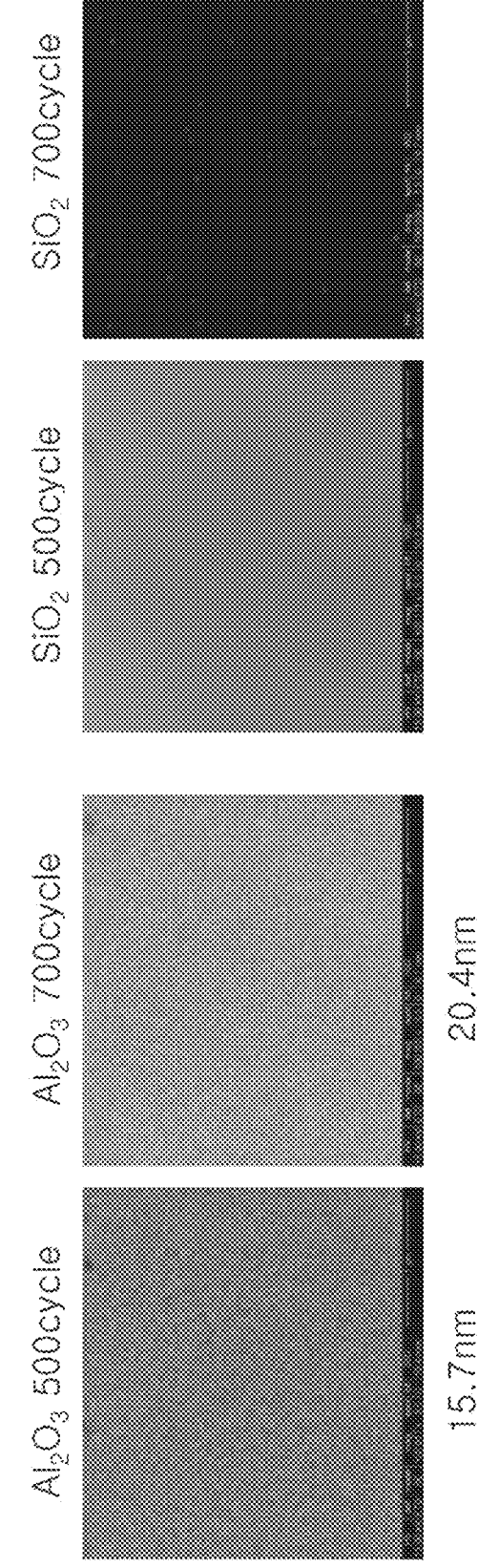
FIG. 9 shows an SEM image of an Ir thin film deposited by performing 500 and 700 deposition cycles using a deposition temperature of 250° C. and an $O_3$ supply time of 30 seconds.

As a result, as shown in FIG. 9, in an experiment conducted with 500 deposition cycles, when the Ir thin film of 15.7 nm was deposited on the $Al_2O_3$ area, no growth of the Ir thin film was observed in the $SiO_2$ area. In addition, in an experiment conducted with 700 deposition cycles, when the Ir thin film of 20.4 nm was deposited on the $Al_2O_3$ area, only a trace amount of Ir nuclei were observed in the $SiO_2$ area and the Ir thin film was not grown.

Figure 10:
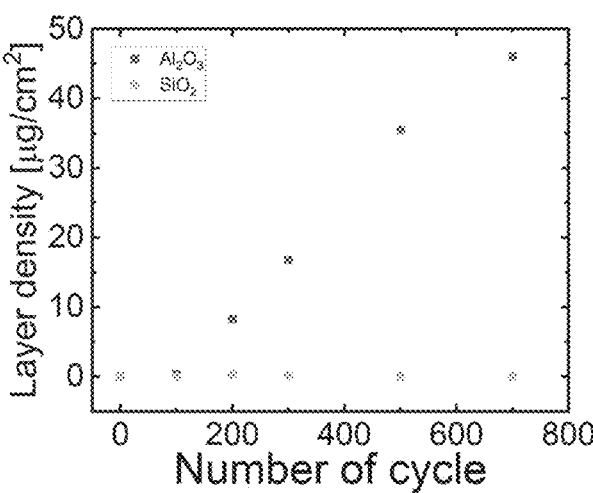
FIG. 10 shows an experimental result showing an amount of Ir deposition according to a deposition cycle when a deposition temperature of 250° C. and an $O_3$ supply time of 30 seconds are applied.

When viewed from the Ir deposition amount results (see FIG. 10), in an experiment conducted with 700 deposition cycles, about 46.0 µg/cm² of Ir was deposited in the $Al_2O_3$ area, while the Ir deposition amount in the $SiO_2$ area was less than or equal to 0.1 µg/cm². For reference, the Ir deposition amount of about 46.0 µg/cm² in the $Al_2O_3$ area means a thickness of about 20.4 nm when converted to theoretical density.

Experimental Example 4: Application of Area Selective Deposition

Figure 11A:
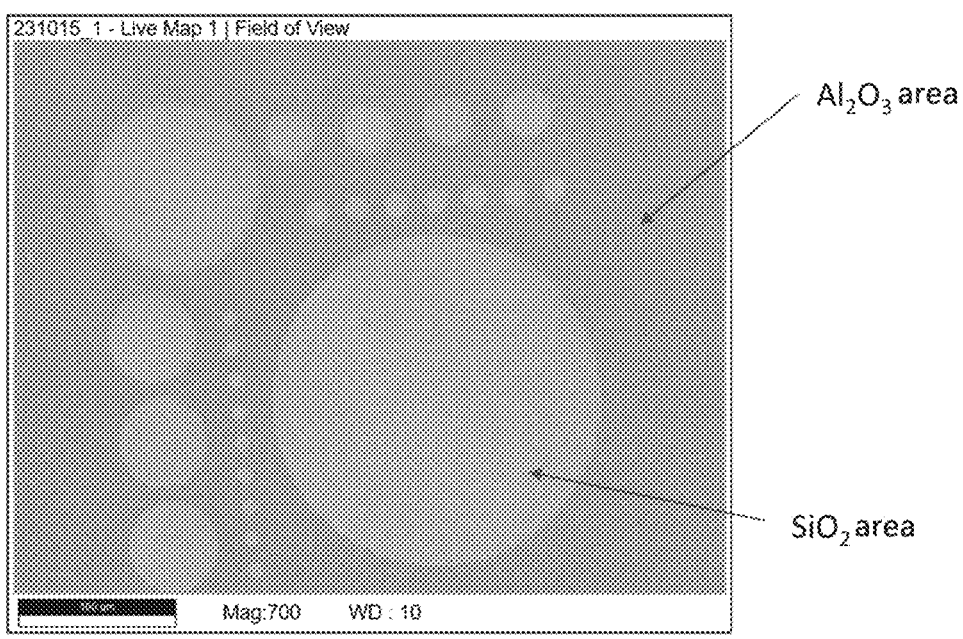
FIGS. 11A and 11B show SEM and EDS analysis results according to Experimental Example 4.
Figure 11B:
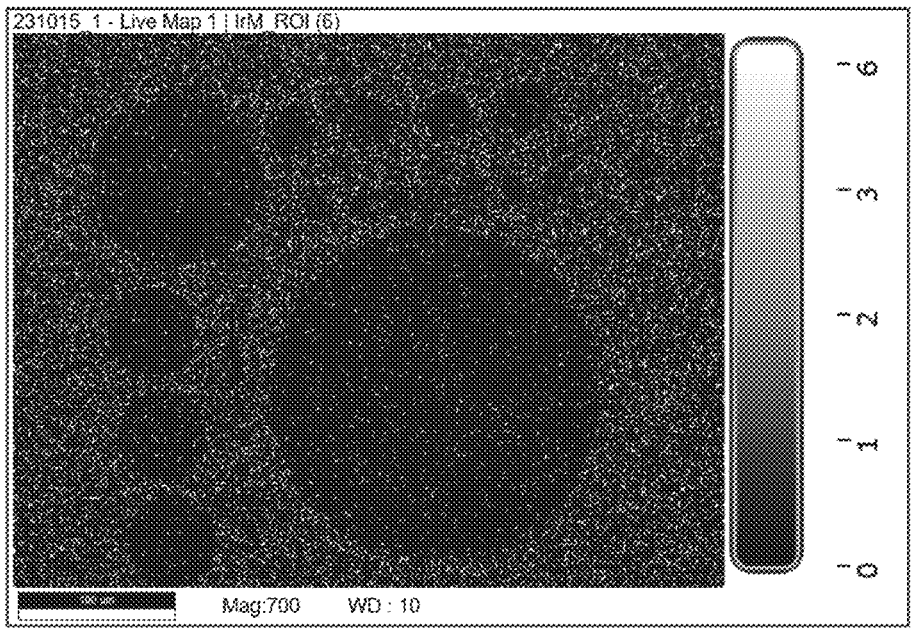

In order to confirm that various types of area-selective deposition may be performed, the growth area ($Al_2O_3$) and non-growth area ($SiO_2$) were defined as specific shapes, and the method for area-selective growth of a noble metal thin film using atomic layer deposition of the present invention was performed. Then, the results were analyzed by SEM and EDS. In detail, as shown in FIG. 11A, a substrate in which circular shapes of various sizes were divided into the non-growth area ($SiO_2$) and the other areas were defined as the growth area ($Al_2O_3$) was prepared, and the atomic layer deposition was performed by applying the process conditions of Experimental Example 1 (deposition temperature of $250°$ C., $O_3$ supply time of 40 seconds, and deposition cycle of 500 times). FIG. 11A is an SEM image after atomic layer deposition, and FIG. 11B is a SEM-EDS analysis result.

Referring to the SEM image in FIG. 11A, it can be confirmed that the Ir thin film with a smooth and continuous surface was deposited in the $Al_2O_3$ area while no Ir thin film was deposited in the $SiO_2$ area. In addition, when viewing the SEM-EDS analysis results in FIG. 11B, it can be confirmed that the Ir elements are distributed in a very uniform form in the $Al_2O_3$ area, and the Ir peak intensity at the noise level is observed in the $SiO_2$ area. Through these results, it can be confirmed that the area-selective deposition of the Ir thin film is carried out precisely.

What is claimed is:

1. A method for area-selective growth of a noble metal thin film using atomic layer deposition, comprising:

a first step of preparing a substrate having a growth area and non-growth area showing a difference in nucleation delay, where the non-growth area generates a noble metal nucleus relatively late compared to the growth area during cycles of repeated atomic layer deposition;

a second step of supplying a noble metal precursor and adsorbing the noble metal precursor to the growth area and the non-growth area of the substrate;

a third step of converting the noble metal precursor into a noble metal atomic layer by supplying an oxidizing agent; and a step of growing a noble metal thin film in the growth area by repeating a combination of the second and third steps, wherein, in the third step, the noble metal nucleus in the non-growth area is converted into a volatile oxide and volatilized by controlling a molar ratio of the noble metal nucleus and the oxidizing agent through control of supply time of the oxidizing agent, and wherein a unit contact area of the non-growth area, where the noble metal nucleus in the non-growth area is in contact with the oxidizing agent, is relatively larger than a unit contact area of the growth area, where the noble metal thin film in the growth area is in contact with the oxidizing agent, thereby promoting generation of the volatile oxide in the non-growth area.

2. The method of claim 1, wherein a novel metal included in the novel metal precursor is a novel metal capable of generating a volatile oxide.

3. The method of claim 2, wherein the noble metal is any one of iridium (Ir), ruthenium (Ru), palladium (Pd), platinum (Pt), and rhodium (Rh).

4. The method of claim 1, wherein the noble metal precursor is an Ir precursor, and the oxidizing agent is $O_3$ or $O_2$ plasma.

5. The method of claim 4, wherein in the third step, Ir is converted to $IrO_3$ and volatilized by controlling the molar ratio between Ir and $O_3$, wherein the molar ratio between Ir and $O_3$ is controlled by controlling $O_3$ supply time so that $O_3$ molar ratio exceeds 2 in a state where the molar ratio between Ir and $O_3$ is 3:2.

6. The method of claim 4, wherein the growth area is an $Al_2O_3$ area, and the non-growth area is a $SiO_2$ area.

7. The method of claim 4, wherein in the third step, Ir is converted to $IrO_3$ and volatilized by controlling the molar ratio between Ir and $O_3$, wherein the molar ratio between Ir and $O_3$ is controlled by controlling the $O_3$ supply time so that the $O_3$ molar ratio is greater than or equal to Ir molar ratio in the molar ratio between Ir and $O_3$.

* * * * *